(12) United States Patent
Ramirez et al.

(10) Patent No.: US 9,110,108 B2
(45) Date of Patent: Aug. 18, 2015

(54) POWER MANAGEMENT ARRANGEMENT AND METHOD IN A UTILITY METER

(75) Inventors: Anibal Diego Ramirez, Indianapolis, IN (US); John T. Voisine, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 390 days.

(21) Appl. No.: 13/464,374

(22) Filed: May 4, 2012

(65) Prior Publication Data

US 2013/0293219 A1 Nov. 7, 2013

(51) Int. Cl.
*G01R 19/00* (2006.01)
*G01R 22/10* (2006.01)

(52) U.S. Cl.
CPC ..................... *G01R 22/10* (2013.01)

(58) Field of Classification Search
CPC ......... G01R 22/10; G01R 19/10; G06Q 50/06
USPC .................. 324/103 R, 116, 76.61, 76.66
See application file for complete search history.

(56) References Cited

U.S. PATENT DOCUMENTS

| | | | | |
|---|---|---|---|---|
| 4,085,287 A * | 4/1978 | Kullmann et al. | ............ | 375/219 |
| 4,106,095 A * | 8/1978 | Yarbrough | .................... | 705/412 |
| 4,335,447 A * | 6/1982 | Jerrim | ............................. | 714/22 |
| 4,361,838 A * | 11/1982 | Mizuta | ..................... | 340/870.02 |
| 4,467,434 A * | 8/1984 | Hurley et al. | ................. | 700/295 |
| 4,504,831 A * | 3/1985 | Jahr et al. | ................. | 340/870.03 |
| 4,509,128 A * | 4/1985 | Coppola et al. | ................. | 702/61 |
| 4,594,545 A * | 6/1986 | Germer | ..................... | 324/103 R |
| 4,631,476 A * | 12/1986 | Germer et al. | ............ | 324/103 R |
| 4,646,084 A * | 2/1987 | Burrowes et al. | ........ | 340/870.03 |
| 4,707,852 A * | 11/1987 | Jahr et al. | ................. | 379/106.03 |
| 4,758,836 A * | 7/1988 | Scuilli | ..................... | 340/870.31 |
| 4,881,070 A * | 11/1989 | Burrowes et al. | ........ | 340/870.02 |
| 5,111,407 A * | 5/1992 | Galpern | .......................... | 702/62 |
| 5,345,231 A * | 9/1994 | Koo et al. | ................. | 340/870.31 |
| 5,523,751 A * | 6/1996 | Byford et al. | ............ | 340/870.02 |
| 5,619,192 A * | 4/1997 | Ayala | ....................... | 340/870.02 |
| 5,627,462 A * | 5/1997 | Whitehead, Jr. | .......... | 324/103 R |
| 5,924,051 A * | 7/1999 | Provost et al. | ................... | 702/61 |
| 6,957,158 B1 * | 10/2005 | Hancock et al. | ................. | 702/61 |
| 7,077,317 B2 * | 7/2006 | Longacre et al. | ............ | 235/454 |
| 7,088,239 B2 * | 8/2006 | Basinger et al. | ........... | 340/539.17 |
| 7,124,948 B2 * | 10/2006 | Longacre et al. | ........ | 235/462.01 |
| 7,209,840 B2 * | 4/2007 | Petite et al. | ..................... | 702/62 |
| 7,239,250 B2 * | 7/2007 | Brian et al. | ............. | 340/870.02 |
| 7,263,073 B2 * | 8/2007 | Petite et al. | ................... | 370/278 |
| 7,385,524 B1 * | 6/2008 | Orlosky | ................... | 340/870.28 |
| 7,498,953 B2 * | 3/2009 | Salser et al. | ............. | 340/870.02 |
| 2010/0052655 A1 * | 3/2010 | King et al. | ................. | 324/103 R |
| 2010/0315263 A1 * | 12/2010 | Shuey | ....................... | 340/870.02 |
| 2013/0018843 A1 * | 1/2013 | Bultman et al. | .............. | 707/609 |

* cited by examiner

*Primary Examiner* — Jermele M Hollington
*Assistant Examiner* — Christopher McAndrew
(74) *Attorney, Agent, or Firm* — Maginot, Moore & Beck LLP (57) ABSTRACT

A system includes a utility meter housing, a power supply, a non-volatile memory, an energy storage device, and a control circuit. The utility meter housing includes metrology circuitry configured to generate metering data regarding electrical power provided to the load. The energy storage device is operably coupled to the power supply. The control circuit is operably coupled to receive power generated by the power supply and receive power from the energy storage device. The control circuit is configured to: receive a first bias power signal; erase first metering information stored in the non-volatile memory; process, subsequent to erasing the first memory location, metering data received from the metrology circuit; receive a first interruption signal indicative of an interruption of power in the power supply; and store, responsive to receiving the first interruption signal, second metering information in the non-volatile memory using power from the energy storage device.

20 Claims, 4 Drawing Sheets

POWER MANAGEMENT ARRANGEMENT AND METHOD IN A UTILITY METER

FIELD OF THE INVENTION

The present invention relates to electricity meters, and more specifically, to electricity meters having persistent data storage.

BACKGROUND

Electrical service providers such as electrical utilities employ electricity meters to monitor energy consumption by customers (or other entities). Electricity meters track the amount of energy consumed by a load (e.g. the customer), typically measured in kilowatt-hours ("kwh"), at each customer's facility. The service provider uses the consumption information primarily for billing, but also for resource allocation planning and other purposes.

Electrical power is transmitted and delivered to load in many forms. For example, electrical power may be delivered as polyphase wye-connected or delta-connected power or as single phase power. Such various forms are known as service types. Different standard electricity meter types, known as meter forms, are used to measure the power consumption for the various service types. The commonly used meter forms in the United States include those designated as 2S, 3S, 5S, 45S, 6S, 36S, 9S, 16S, 12S and 25S meter forms, which are well known in the art.

Electrical service providers have historically billed for electrical service in arrears, using information stored within the electricity meter to determine the amount of each invoice. In a typical operation, the electricity meter stores a value representative of the amount of energy consumed in a mechanical or electronic accumulation register. From time to time, the electrical service provider obtains the value of the register and bills the customer accordingly. For example, a meter reader employed by the service provider may, each month, physically read the register value off of a meter display. The service provider then employs the obtained register value to determine the amount of electricity consumed over the month and bills the customer for the determined amount.

While electricity meters often employ electromechanical means, such as rotating disks and mechanical counters, to detect and register electricity consumption, newer meters increasingly employ digital processing circuitry instead of the rotating disk and mechanical counters. In such meters, sensors within the meter detect the voltage and current that is delivered to the load. Circuitry within the meter converts the sensed voltage and current into digital values. Processing circuitry then employs digital signal processing to calculate the quantity of consumed energy, among other things, from the digital values. Electronic meters provide greater flexibility in the types of energy consumption information that they can calculate, track, and store. Electronic meters can also facilitate remote meter reading by including a communication means such as radio communication circuits.

One of the few drawbacks of electronic meters is that the metrology and processing circuits require an electronic power supply. The power supply provides the DC bias voltage necessary for operation of digital circuits. To this end, the power supply typically operates to convert the AC line voltage into one or more usable DC voltages. In many cases, the power supply circuitry includes a voltage converter as well as voltage regulators.

While electrical power for the power supply is readily available from the AC power lines, issues can arise in the event of an electrical service interruption. During an electrical service interruption, the electronic power supply cannot operate and is unable to bias the internal circuits. As a consequence, stored data can be lost. To avoid such losses, it is known to employ temporary power from a battery or large capacitor to store critical meter data to non-volatile memory within the meter in the event of an external power interruption. The capacitor or battery provides temporary power, thereby allowing the meter to gracefully power down when the external utility power is lost.

A drawback of the prior art method of preserving data during a power outage is the requirement for a sufficient source of back-up bias power for the circuit operations that must occur to accomplish all of the power down operations. In some cases, the meter may already require a battery or capacitor to facilitate other operations, such as clock maintenance or the like. In such cases, the additional power need to operate the power down sequence can introduce additional burden. There is a need therefore, for a metering arrangement that employs power down operations with reduced component count and/or size.

SUMMARY

At least some embodiments of the present invention address the above-referenced issue by implementing a specific set of operations that more efficiently manage the power usage during power down situations, thereby reducing the need for a large back-up power source.

A first embodiment is a system for use in a utility meter. The system includes a utility meter housing, a power supply, a non-volatile memory, an energy storage device, and a control circuit. The utility meter housing includes metrology circuitry configured to generate metering data regarding electrical power provided to the load. The utility meter includes a connection to the utility power service. The energy storage device is operably coupled to the power supply. The control circuit is operably coupled to receive power generated by the power supply and receive power from the energy storage device. The control circuit is configured to: receive a first bias power signal; erase first metering information stored in the non-volatile memory; process, subsequent to erasing the first memory location, metering data received from the metrology circuit; receive a first interruption signal indicative of an interruption of power in the power supply; and store, responsive to receiving the first interruption signal, second metering information in the non-volatile memory using power from the energy storage device.

Such an embodiment allows for a reduced size or capacity energy storage device by eliminating at least one step that typically would occur during a power down sequence. In particular, by erasing the non-volatile memory upon power up, the step of erasing the non-volatile memory during power down can be eliminated. Because that step is not necessary on power down, the energy storage requirements are reduced. Accordingly, the energy storage device may be reduced in size and/or capacity.

The above-described features and advantages, as well as others, will become more readily apparent to those of ordinary skill in the art by reference to the following detailed description and accompanying drawings.

DETAILED DESCRIPTION

Figure 1:
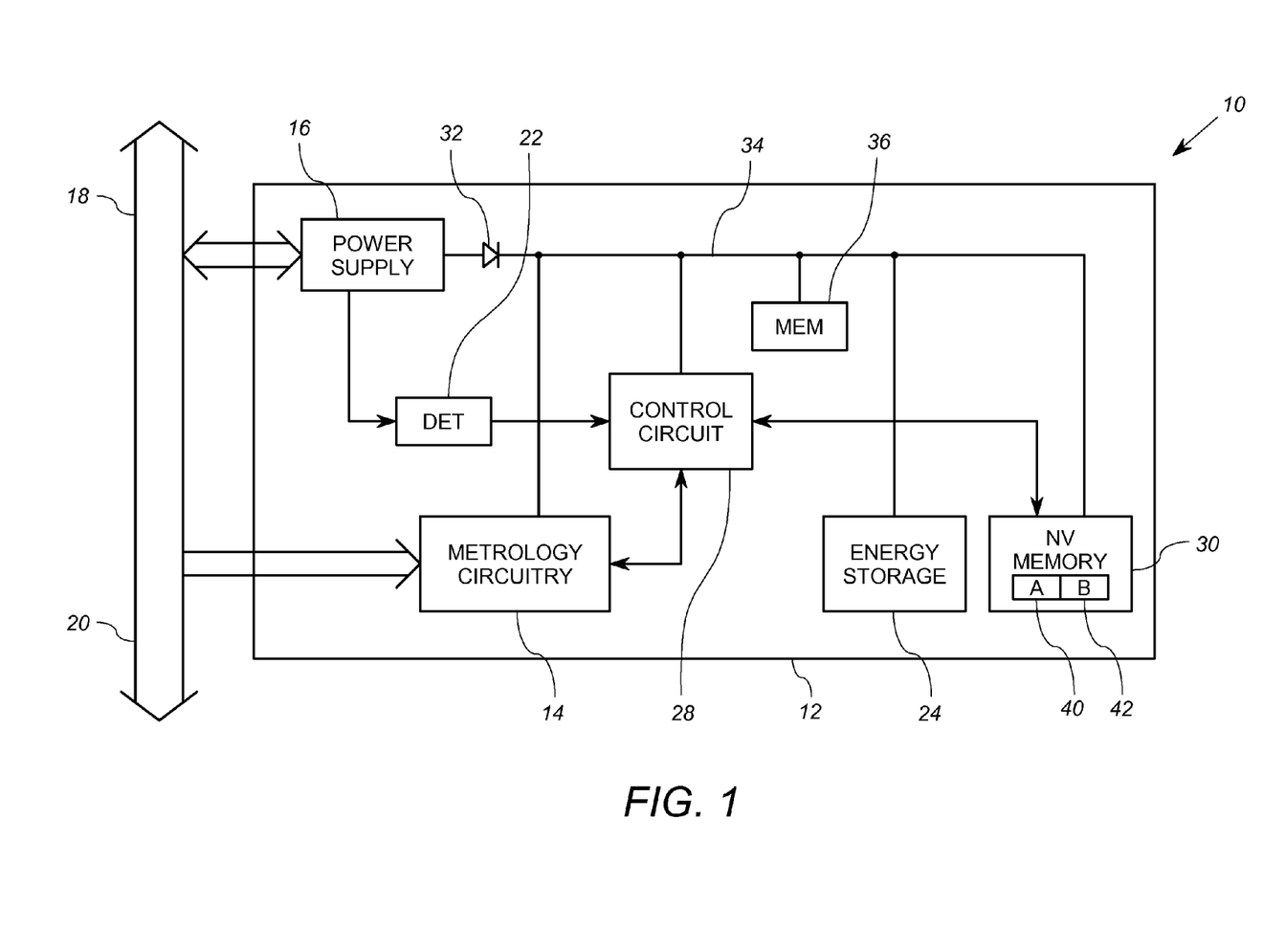
FIG. 1 is a schematic block diagram of a metering arrangement according to a first exemplary embodiment of the invention.

FIG. 1 shows a metering arrangement 10 that is configured for performing power down data storage with reduced power consumption. The metering arrangement 10 includes a utility meter housing 12 in which is supported metrology circuitry 14 that is configured to generate metering information regarding electrical power provided to the load. The electric utility, not shown, provides electrical power via line side conductors 18 to the metering arrangement 10. The load side conductors or feeder lines 20 distribute the power received from the line side conductors 18 to the load, not shown. The arrangement 10 further includes a power supply 16, a power interruption detection circuit 22, an energy storage device 24, a processing or control circuit 28, a non-volatile memory 30, a rectification device 32, and volatile memory 36, all of which are supported in or on the housing 12. It will be appreciated that the housing 12 further can support other meter circuitry, not shown in FIG. 1.

The metrology circuit 14 is any suitable circuit that detects, measures, and determines one or more electricity and/or electrical energy consumption values based on energy flowing from the line-side conductors 18 to the load-side conductors 20. Such circuits are known in the art and can take many forms. A non-limiting example of a suitable metrology circuit is described below in connection with FIG. 3. In this embodiment, the metrology circuit 14 may include an RF communication device, not shown that is configured to transmit meter data to a remote device.

The power supply 16 is a conventional power supply circuit used in utility meters to convert incoming line power (such as 120 AC voltage, 240 AC voltage or the like) to regulated and/or unregulated DC bias voltage. Such power supply circuits are known. The power supply 16 is configured to provide normal operating power to the metrology circuit 14 and the control circuit 28 of the arrangement 10, among other things. To this end, the power supply 16 is coupled to a power bus 34 via the rectification device 32. The power bus 34 is, in turn, coupled to the bias power inputs of the metrology circuit 14, the control circuit 28, the energy storage device 24, the non-volatile memory 30, and the memory 36.

Accordingly, the power supply 16 is also operably coupled to provide a charging current to the energy storage device 24 via the rectification device 32 and power bus 34. The rectification device 32 is provided to prevent discharge of the energy storage device 24 back through the power supply 16.

The power interruption detection circuit 22 is a circuit configured to detect an interruption of power to the meter 10. To this end, the power interruption detection circuit 22 may suitably be connected to a node within, or at the output of, the power supply 16 which has a voltage level that corresponds to the power provided to the metering arrangement 10. In many cases, a simple detection of the power supply output voltage would be sufficient.

In any event, the voltage detection circuit 22 is configured to provide a detection signal if the voltage at the detection point (and hence the power to the meter 10, or at least the output voltage of the power supply) falls below a predetermined level. Such circuits are known in the art. The detection circuit 22 is operably coupled to provide the detection signal (indicative of a power failure) to the control circuit 28.

It will be appreciated that, as used in connection with this embodiment, "power failure" shall mean any interruption that causes an interruption of power to the circuits of the metering arrangement 10, and would thus include a service interruption upstream of the line-side conductors 18, an accidental or purposeful disconnection of the power supply 16 from the line-side conductors 18, and an internal disconnection between the power supply 16 and the circuits 14, 28 and 30.

Referring again generally to FIG. 1, the energy storage device 24 is preferably a capacitor that is used to provide temporary power to at least the control circuit 28 in the event of a utility power interruption. Accordingly, the energy storage device 24 is also coupled to the power inputs of the control circuit 28. In this embodiment, the energy storage device 24 both receives charging energy from, and provides temporary power to, the main power bus 34 of the arrangement 10.

A limitation of the energy storage device 24 is that it must be sufficiently sized to provide adequate power to carry out the power down operations of the control circuit 28, and possibly other circuits. Power down operations occur under power fail conditions to the metering arrangement 10. Such operations include the storage of critical metering data within the non-volatile memory 30. In the embodiment described herein, the metering arrangement 10 is configured such that power down operations require reduced energy, thereby allowing the energy storage device 24 to be reduced in size and weight. The reduction in size and weight advantageously reduces meter weight, and provides additional interior space for other components. Further details on the reduced power consumption upon power failure are provided The control circuit 28 is operably coupled to the metrology circuit 14 and the detector 22. The control circuit 28 is any logic circuit, processor or controller capable of carrying out the operations ascribed to it herein. In many cases, the control circuit 28 comprises the same chip and/or processor or controller that performs many of the operations of the metrology circuit 14. It is known in the metering art to employ the same processor for both metrology operations and controller operations. However, it is also known to use a first processing circuit primarily for energy calculations, and a second processor for control operations and further processing of metering values. Various architectures of electronic meters are well known. Thus, the control circuit 28 may have standard operations of an electronic meter in addition to the operations described herein.

In accordance with at least this embodiment of the present invention, the control circuit 28 is further configured to, in response to a power interruption detection signal from the detection circuit 22, carry out power down operations as will be described further below.

The non-volatile memory 30 preferably comprises an electronically erasable and writeable memory such as a flash memory. The non-volatile memory 30 includes at least two separate areas or locations 40, 42 which may be separately accessed and separately block-erased. Each location 40, 42 has sufficient memory space to store all of the critical data of the meter. The non-volatile memory 30 may suitably be other areas and locations which can store data and parameter tables, programming instructions, and other persistent information.

In normal energy delivery operation, the utility provides electricity to the load via the line-side conductors 18 and the load-side conductors 20. The metrology circuit 14 senses or otherwise measures the electrical energy flowing through the load-side conductors 20 and generates metering information therefrom. In such normal operation, power supply 16 receives power from the line-side conductors 18 and generates bias power for the metrology circuit 14, the control circuit 28 and the non-volatile memory 30. To this end, the power supply 16 is operably coupled to the metrology circuit 14, the control circuit 28 and the non-volatile memory 30 via the power bus 34. In addition, the power supply 16 is further operably connected to provide charging power to the energy storage device 24 via the power bus 34.

It will be appreciated that the metrology circuit 14 and/or control circuit 28 may cause metering information to be displayed on a display, not shown, and/or communicated to a remote location by a transmitter, also not shown. The details of suitable meter displays and/or communication devices would be known to those of ordinary skill in the art.

From time to time, a power interruption may occur. In such cases, it is desirable for the control circuit 28 to perform some power down operations, which may include storage of critical data to the non-volatile memory 30. Such operations are typically powered in part or in whole by the stored energy in the energy storage device 24. In accordance with embodiments of the present invention, the control circuit 28 stores the critical data to a pre-erased portion of the non-volatile memory 30. Because the control circuit 28 stores to a pre-erased portion of the non-volatile memory 30, the control circuit 28 does not perform both the erasure step and the critical data storage step during the power down operations. Accordingly, the energy storage requirements of the energy storage device 24 are reduced.

Accordingly, upon reception of a power interruption detection signal from the detection circuit 22, the control circuit 28 stores the metering critical data to the non-volatile memory 30. Upon restoration of power, the control circuit 28 both retrieves the stored critical data from the memory 30 and erases the memory 30, prior to beginning normal metering operations. The control circuit 28 may thereafter cooperate with the metrology circuit 14 to resume normal metering functions. The erasure of the memory 30 upon restoration of power ensures that the non-volatile memory 30 includes a pre-erased location during the next power failure.

Figure 2:
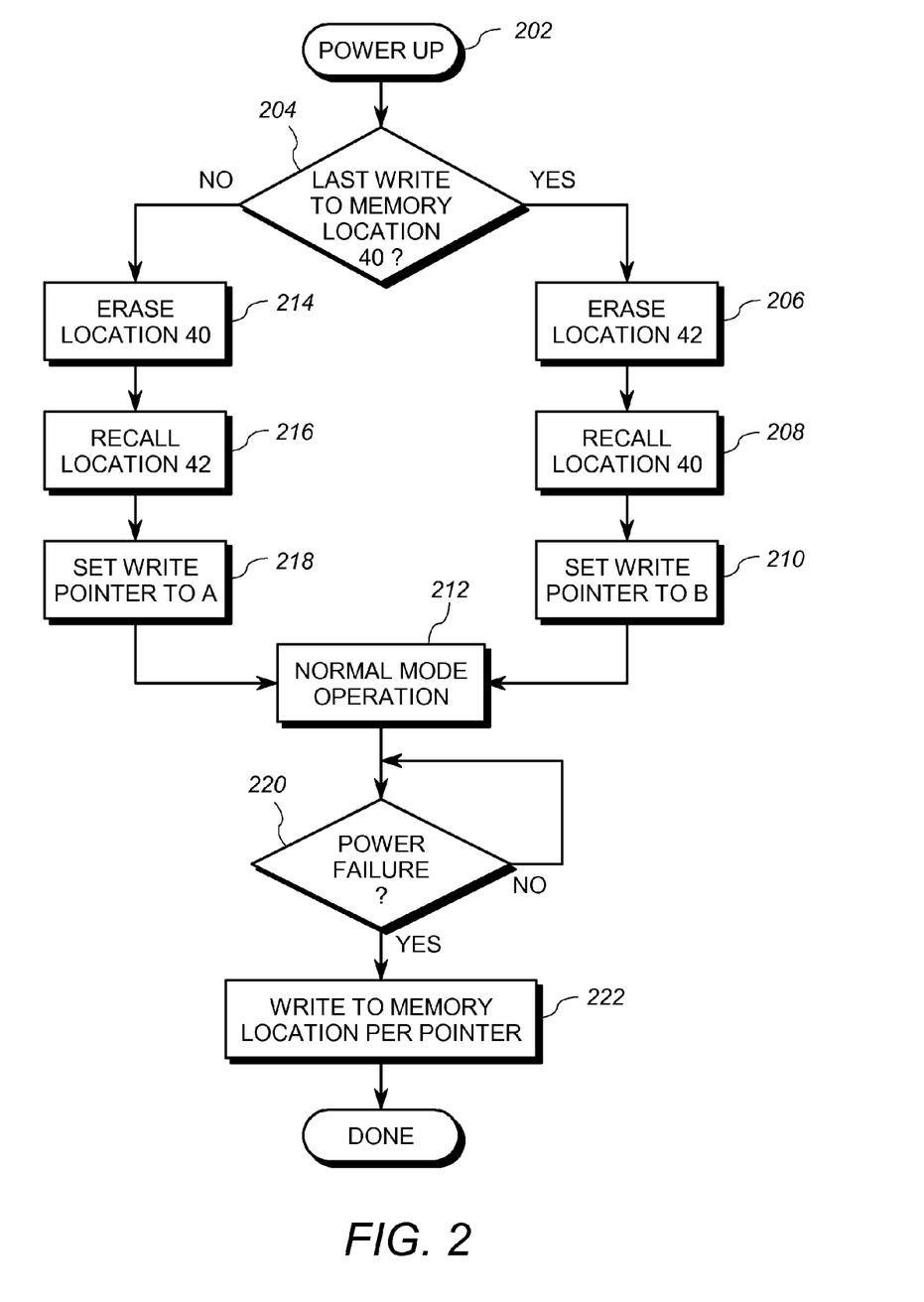
FIG. 2 is a flow diagram of the operations of the control circuit of FIG. 1.

FIG. 2 shows in further detail the operations of the control circuit 28 to carry out the operations described above. Prior to step 202, the control circuit 28 does not operate because it does not receive power from the power supply 16. The lack of power may be due to a power failure, or due to a new installation of the meter.

In step 202, the control circuit 28 powers up at the receipt of sufficient power and begins power-up operations. The control circuit 28 then executes step 204. In step 204, the control circuit 28 determines whether it last wrote critical data to location 40 of the non-volatile memory 30. As discussed above, the non-volatile memory 30 includes two locations 40, 42. In this embodiment, the control circuit 28 alternatingly stores critical data in the two locations 40, 42 to allow for retention of stored critical data in one of the locations while the other location is erased. Accordingly, the control circuit 28 must first determine the memory location 40, 42 to which it most recently stored critical data. To do so, the control circuit 28 compares the time stamps associated with each memory location 40 and 42. As will be discussed below, each time critical data is stored to one of the locations 40, 42, a time stamp is stored with the critical data.

If the control circuit 28 determines in step 204 that it last wrote critical data to location 40, then the control circuit 28 proceeds to step 206. Otherwise, the control circuit 28 proceeds to step 214.

In step 206, the control circuit 28 erases the second memory location 42. To this end, the control circuit 28 performs a conventional block erase function to shorten the erase cycle. Thereafter, in step 208, the control circuit 28 obtains the critical data that is stored in the first memory location 40. Such data represents, in the typical case, the critical data most recently stored at the last power failure. The control circuit 28 stores the data in local volatile memory 36 and/or provides the data to the metrology circuit 14 as needed.

It will be appreciated that the identification of what constitutes "critical data" in a meter, and the details of its usage, is known in the art, and may vary from meter to meter. At a minimum, the critical data includes an energy consumption value or other billing value representative of energy consumption measurements and/or billing data accumulated prior to the energy interruption that preceded step 202. Such data is critical because the loss of energy consumption information and/or billing data during a power failure can lead to substantial lost revenue. As mentioned previously, a time and date stamp is further stored in connection with the critical data and may be considered a portion thereof.

After step 208, the control circuit executes step 210. In step 210, the control circuit 28 sets a pointer value to a value B representative of the second memory location 42 of the non-volatile memory 30. As will be discussed below, the control circuit 28 uses the value of the pointer to determine which location 40, 42 to store critical data during the next power interruption. After step 210, the control circuit 28 proceeds to step 212 to begin normal metering operations.

As discussed above, if the answer in step 204 is in the negative, then the control circuit 28 executes step 214 instead of step 206. In step 214, the control circuit 28 block erases the first memory location 40. Thereafter, in step 216, the control circuit 28 obtains the critical data previously stored in the second memory location 42. The control circuit 28 stores the data in local volatile memory 36 and/or provides the data to the metrology circuit 14 as needed.

Thereafter, in step 218, the control circuit 28 sets a pointer value to a value representative of the first memory location 40 of the non-volatile memory 30. After step 218, the control circuit 28 proceeds to step 212 to begin normal metering operations.

In step 212, the control circuit 28 performs normal metering operations using, at least in part, the data retrieved during steps 208 or 216. For example, the retrieved critical data may include an energy consumption registration value. The energy consumption registration value is a value representative of accumulated energy consumption, similar to the value displayed on the front of both electronic and electromechanical meters. Once normal operations continue in step 212, the control circuit 28 will add new detected energy consumption values to the energy consumption registration value stored in the volatile memory 36. As is known in the art, the control circuit 28 may further cause such values to be displayed on a meter display, not shown in FIG. 1, but which is known in the art.

In step 220, the control circuit 28 determines whether it has received a power interruption detection signal from the detection circuit 22. If not, the control circuit 28 continues normal operation mode and returns to step 220. If, however, the control circuit 28 determines that it has received a power interruption detection signal, then the control circuit proceeds to step 222.

In step 222, the control circuit 28 stops normal metering operations and writes critical data to the non-volatile memory 30. To this end, the control circuit 28 writes to the location 40, or 42 of the memory 30 that corresponds to the pointer value.

Thus, if the pointer value is A, then the control circuit 28 writes the critical data to the first location 40 of the non-volatile memory 30. However, if the pointer value is B, then the control circuit 28 writes the critical data to the second location 42 of the non-volatile memory 30.

The control circuit 28 thereafter stops operating due to the lack of power. Thereafter, the control circuit 28 begins operating again in step 202 when power is restored, and returns to step 202.

The above-described embodiment thus allows for storage of critical data without requiring the control circuit 28 to perform both the block erase and the write operations at power down. As a consequence, the size and capacity of the energy storage device 24 may advantageously be reduced.

Figure 3:
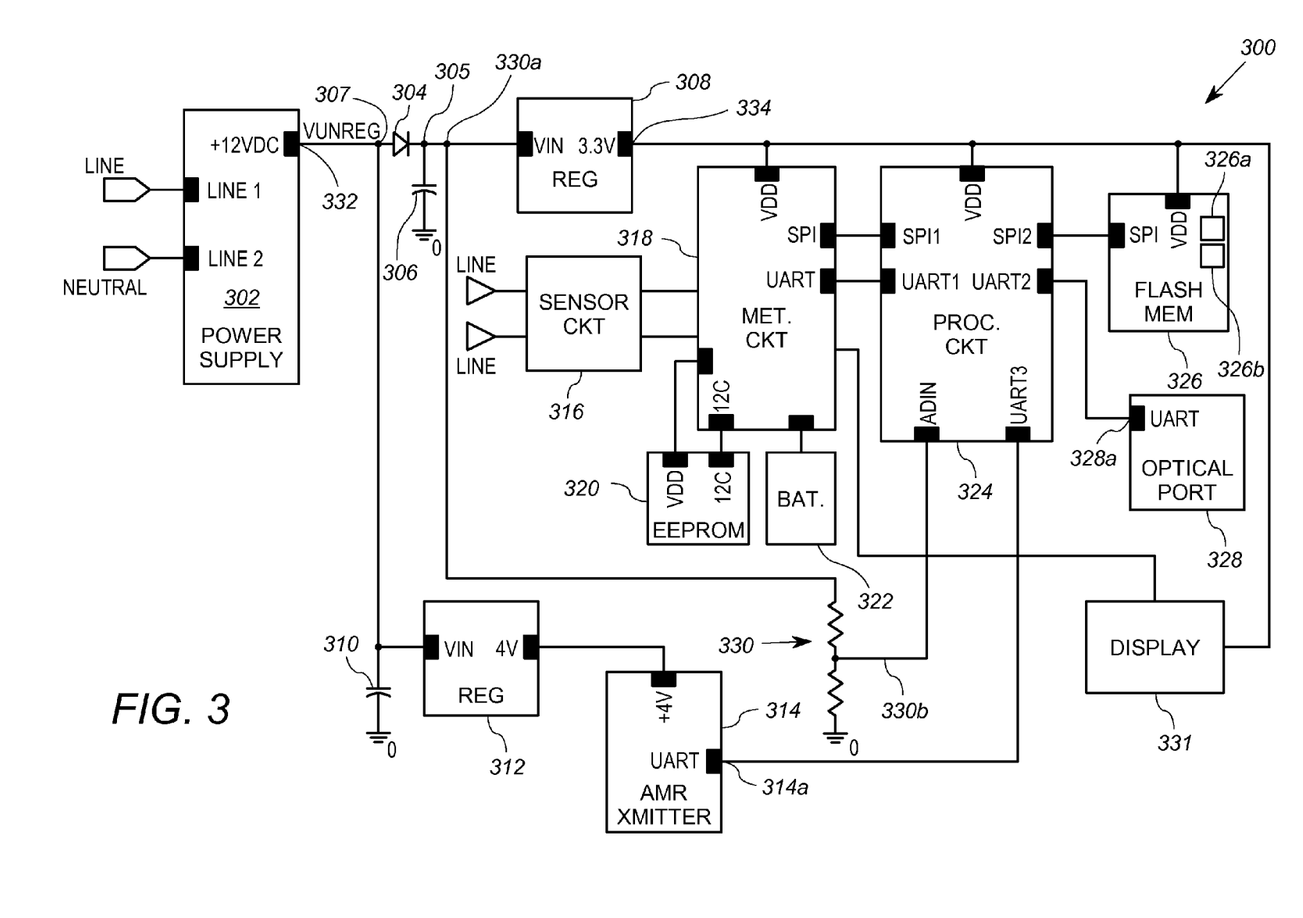
FIG. 3 is a schematic block diagram of an electricity meter according to a second exemplary embodiment of the invention.

FIG. 3 shows in more detail another embodiment of a system 300 for use in an electricity meter that incorporates elements of the invention. The system 300 includes a switching power supply 302, a diode 304, a hold-up capacitor 306, a first regulator 308, a boost capacitor 310, a second regulator 312, an automatic meter reading ("AMR") transmitter 314, a sensor circuit 316, a metering circuit 318, an EEPROM 320, a battery 322, a processor circuit 324, a flash memory 326, an optical communication port 328, a voltage divider 330, and a display 331. In this embodiment, the sensor circuit 316, the metering circuit 318 and part of the function of the processing circuit 324 are collectively considered to be the metrology circuit.

The switching power supply 302 is operably connected to receive line voltage from an AC line and generate an unregulated DC output voltage therefrom. The switching power supply 302 is operably connected to provide the unregulated DC output voltage to the unregulated output 332. The diode 304 is coupled in series between the unregulated output 332 and the first regulator 308. The hold-up capacitor 306 is coupled between a node 305 and ground. The node 305 is located between the diode 304 and the first regulator 308 and ground. The hold-up capacitor 306 in this embodiment is preferably sized to provide sufficient energy to allow the processing circuit 324 to write critical data to the flash memory 326. The hold-up capacitor 306 in the embodiment of FIG. 3 is 2200 microfarads.

The boost capacitor 310 is coupled between a node 307 and circuit ground. The node 307 is located between the output 332 and the second regulator 312 and circuit ground. The boost capacitor 310 is a capacitor that provides a power boost during transmissions by the transmitter 314. In particular, because meters only occasionally transmit information, it is often more effective to implement a boost capacitor to provide temporary energy needed for transmission. Further detail regarding the use of boost capacitors is provided in, for example, U.S. Pat. No. 6,995,685, which is incorporated herein by reference. In this embodiment, the boost capacitor 310 has a capacitance of 4700 microfarads.

The first regulator 308 is a voltage regulator that is configured to receive an unregulated DC voltage of on the order of 12 volts, and provide at an output 334 a regulated bias voltage of approximately 3.3 volts. The output 334 is operably coupled to bias voltage inputs of the metering circuit 318, the processor circuit 324, the display 331 and the flash memory 326.

The sensor circuit 316 in one embodiment includes voltage sensors and current sensors, not shown that are operably coupled to detect voltage and current signals representative of voltage and current provided to a load, and to generate measurement signals therefrom. In particular, the measurement signals generated by the sensor circuit 110 are analog signals each having a waveform representative of the voltage and current provided to the load. A suitable example of a voltage sensor of the sensor circuit 110 includes a resistive voltage divider that is operably coupled to the AC power lines. A suitable example of a current sensor of the sensor circuit 110 includes a current transformer that is disposed in a current sensing relationship with the power line signal. These and other voltage and current sensors are known in the art.

The metering circuit 318 is a circuit that is configured to receive the analog measurement signals from the sensor circuit 316 and generate energy consumption values therefrom. According to an exemplary embodiment, the metering circuit 318 includes A/D conversion circuit that convert analog measurement signals into digital measurement signals, and digital processing circuitry that processes the digitized measurement signals to thereby generate the energy consumption data. Such circuits are well known in the art. In this embodiment, the metering circuit 318 may suitably be a metering integrated circuit available from Maxim Products, Inc. the Teridian 71M6513 or a comparable device. In other embodiments, separate A/D converters and digital processing devices may be used.

The metering circuit 318 is further connected to communicate data with the EEPROM 320. The EEPROM 320 stores calibration constants and other meter configuration information used by the metering circuit 318 in its ongoing calculations. The metering circuit 318 is also operably connected to a back-up power source 322 that powers the internal real time clock in the Teridian metering IC, which may run in some circumstances when power to the power supply 302 is interrupted. The metering circuit 318 in this embodiment is configured to generate periodic energy consumption values and provide them to the processing circuit 324. The processing circuit 324 may in turn use such values for various applications, including remote communications, maintenance of load profiling records, adjustments to billing values, and other applications known in the metering art.

In this embodiment, the metering circuit 318 (in the form of the Teridian IC) is operably coupled to and controls the operation of the display 331. Moreover, the metering circuit 318 is configured to cause the display 331 to display values either generated internally, or received from the processing circuit 324. In this embodiment, the metering circuit 318 typically displays metering data (i.e. billing information) that received from the processing circuit 324. However, it will be appreciated that the exact allocation of ongoing metering calculation tasks between the metering circuit 318 and the processing circuit 324 may vary from system to system.

The flash memory 326 is operably connected to receive data to be stored from the processor circuit 324. The flash memory 326 includes a serial port for communicating data to and from the processing circuit 324. In this embodiment, the flash memory 326 includes first and second memory locations 326a, 326b that are allocated to the storage of critical data during a power outage. Such critical data can include current energy consumption values, time stamps of power outages, and data related to any detected tamper event that may have occurred such as meter cover removal, excessive external DC magnetic fields and any unusual tilt or mechanical shock. The details of detecting such tamper events within a meter using additional sensors are known in the art, and have been omitted herein for clarity of exposition.

The flash memory 326 may suitable have other memory locations used for data tables, parameter tables and the like. One example of data stored in the flash memory 326 is load profile data. Load profile data, as is known in the art, is data regarding energy usage over various periods of time.

The optical communication circuit 328 is a circuit that includes elements for performing short-range optical communications, such as an optical transceiver, as well as circuitry supporting digital communications. The optical communication circuit 328 includes a UART port 328a operably connected to a corresponding port in the processing circuit 328.

The AMR transmitter 314 is a wireless radio device that is configured to communicate metering information, as well as other information, with a remote device, not shown, such as a utility service provider computer or data system. Such wireless radio devices are known in the art, and may comprise a radio transceiver that receives data as well as transmitting data. The AMR transmitter 314 includes a UART port 314a operably connected to corresponding port UART3 in the processing circuit 324. As discussed above, the AMR transmitter 314 is operably connected to receive bias power from the voltage regulator 312, and a power boost for transmission from the capacitor 310.

The processing circuit 324 is a programmable processor related devices that cooperate to perform higher level data processing, storage and communication of energy consumption information generated by the metering circuit 318. While the metering circuit 318 generates relatively raw energy consumption information, current information and voltage measurement information, the processing circuit 324 is configured to execute additional functions needed to generating the metering/billing values, including by not limited to those associated with watt-hour metering, demand metering, time-of-use metering, load-profiling, and other metering functions. Moreover, the processing circuit 324 maintains current billing/metering information in local RAM. The processing circuit 324 furthermore controls communication of metering data via the AMR transmitter 314, and/or the optical port 328. The processing circuit 324 also provides metering information from RAM to the metering circuit 318 for display of information on the display 331.

In addition, the processing circuit 324 is configured to perform the storage operations upon a power interruption (and subsequent power restoration), discussed further below in connection with FIG. 4.

The voltage divider 330 in this embodiment operates as a voltage sensing circuit. To this end, the voltage divider 330 operates to provide at an output 330b a measure of the voltage detected at an input 330a. The input 330a is coupled to the node 305. The output is operably connected to the processing circuit 324.

In the normal ongoing operation of the system 300 of FIG. 3, sensor circuit 316 senses and generates voltage and current measurement signals representative of the voltage and current waveforms on the power lines being metered. The sensor circuit 316 provides the voltage and current measurement signals to the metering circuit 318. The metering circuit 318 converts the voltage measurement and current measurement signals into corresponding digital signals. The metering circuit 318 furthermore calculates energy consumption information based on the digitized voltage measurement and current measurement signals in a conventional manner.

The metering circuit 318 provides calculated energy consumption information, and optionally other voltage and current information, to the processing circuit 324 on a periodic basis. In this embodiment, the metering circuit 318 further causes energy consumption information to be provided to the display 331, in accordance with metering information provided to the metering circuit 318 from the processing circuit 324.

The processing circuit 324 obtains energy consumption values from the metering circuit 318 and further processes the values to generate metering information for billing purposes and other purposes. In addition, the processing circuit 324 generates metering information related to specific billing practices, for example, demand metering data or time-of-use metering. The processing circuit 324 causes the processed energy consumption information to be displayed on the display 331, communicated via the AMR transmitter 314, or stored in inherent RAM memory (within the processing circuit 324) or in the flash memory 326.

In general, the metering circuit 318, the processing circuit 324 and the flash memory 326 receive bias power from the regulated output 334 of the first regulator 308. To this end, the off-line switching power supply 302 receives the AC line voltage from the power lines, not shown. The power supply 302 provides an unregulated DC voltage of approximately 12 volts DC to the first regulator 308 via the diode 304. The hold-up capacitor 306 also receives the unregulated voltage from the power supply 302. Due to the continuous connection to the unregulated voltage during normal operation, the hold-up capacitor 306 remains fully charged.

The first regulator 308 converts the unregulated DC voltage to a regulated bias voltage used in digital circuit, such as, for example, 3.3 volts DC. The first regulator 308 provides the regulate DC voltage to the bias power inputs of the metering circuit 318, the processing circuit 324, the display 331 and the flash memory 326.

Also during normal operation, the boost capacitor 310 receives charging current from the unregulated DC voltage output 332 of the off-line switching power supply 302. Due to the continuous connection to the unregulated DC voltage output 332, the boost capacitor 310 is normally charged and ready to provide boost current to the AMR transmitter 314 as well as the remainder of the elements 318, 324 and 326 in the event of an AMR transmission.

In particular, from time to time, the processing circuit 324 arranges to transmit metering data to a remote device via the AMR transmitter 314. To this end, the AMR transmitter 314 obtains data from the processing circuit 324 via the data port UART3. The transmitter 314 then generates the appropriate transmission signals and protocols to transmit the data using a dedicated radio connected to a wireless network. Such systems are known. The transmission requires substantially more power than that needed for the normal operation of the metering circuit 318, the processing circuit 324, and the flash memory 326. To this end, the boost capacitor 310 provides additional power to the AMR circuit 314 via the second regulator 312. Once the transmission is complete, the boost capacitor 310 is at least partially discharged. Accordingly, once the transmission is complete, the switching power supply 302 provides charging current to recharge the boost capacitor 310 before the next transmission. As mentioned above, such a system is described, for example, in U.S. Pat. No. 6,995,685.

The hold-up capacitor 306 provides temporary power to at least the processing circuit 324 and the flash memory 326 in the event of a power interruption. In particular, in the event of a power interruption on the power lines, the switching power supply 302 cannot produce the unregulated DC voltage. As a consequence, the hold-up capacitor 306 discharges by providing current to the first regulator 308, which in turn provides the bias voltage to the processing circuit 324 and the flash memory 326. As will be discussed below in connection with FIG. 4, the processing circuit 324 performs a shut-down or power down routine which involves writing select meter data to the flash memory 326. Thus, the hold-up capacitor 306 preferably has a size and/or capacity to provide sufficient power to carry out that storage operation.

Figure 4:
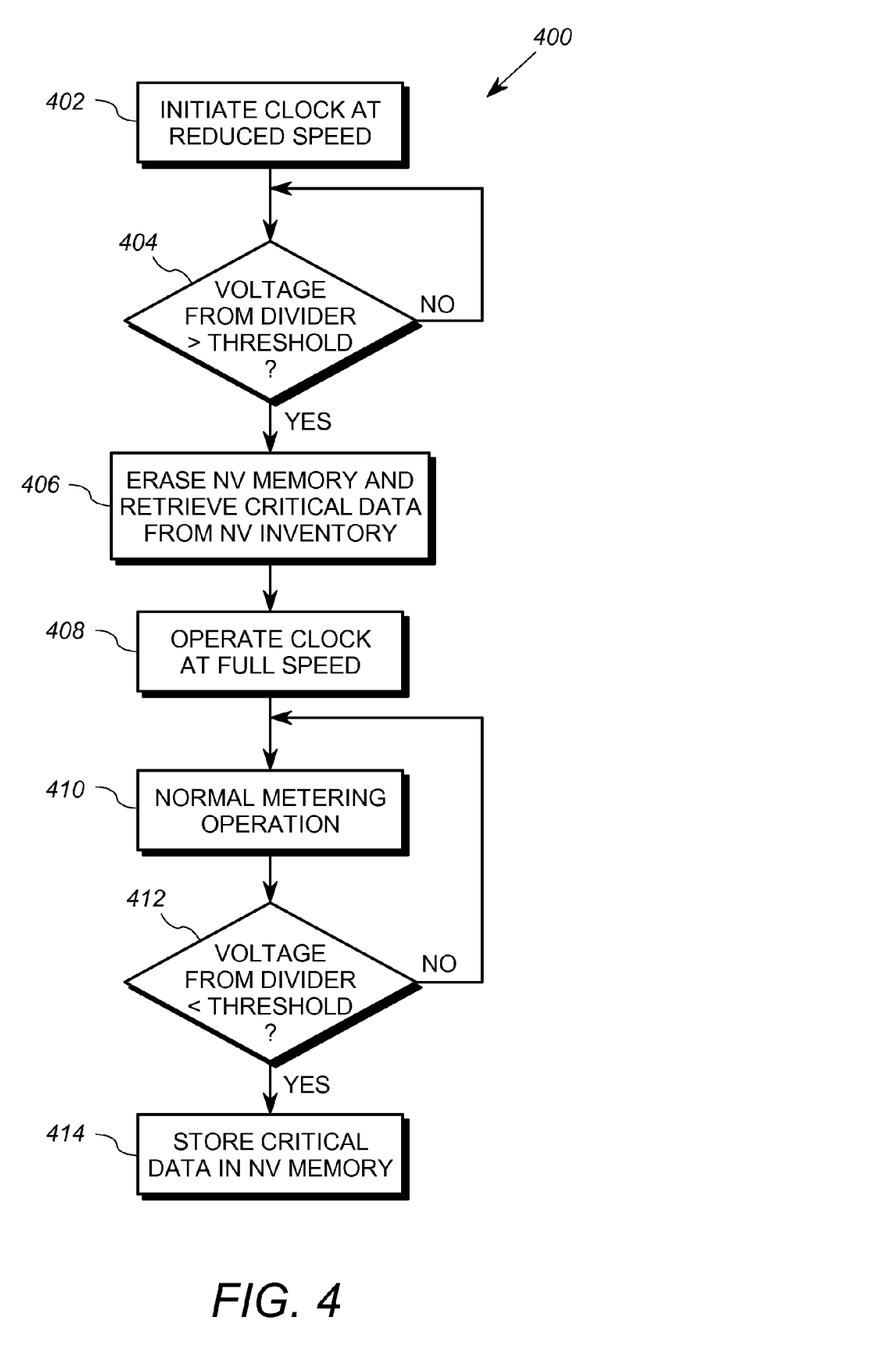
FIG. 4 is a flow diagram of exemplary operations of a control circuit of the meter of FIG. 3 that may be carried out to implement power fail operations.

Referring now to FIG. 4, shown is a flow diagram 400 of an exemplary set of operations performed by the processing circuit 324 in its normal operations from initial power up until power is interrupted or removed. It will be appreciated that normal metering operations not specifically related to power up and power down operations are illustrated simply as "normal metering operations". Such operations can vary widely from meter to meter without departing from the principles of this embodiment of the invention.

The operations of the flow diagram first begin upon initial power up of the processing circuit 324, as when first regulator 308 first has sufficient power to provide bias power to the processing circuit 324. At that point, in step 402, the processing circuit 324 initiates itself using a first clock speed which is reduced with respect to the normal clock speed used in normal metering operations (step ________, discussed further below). The details of varying clock speed in many conventional processing devices would be known to one of ordinary skill in the art.

Thereafter, in step 404, the processing circuit 324 determines whether the voltage across the hold-up capacitor 306 exceeds a predetermined threshold. The threshold is one in which it is clear that the hold-up capacitor 304 is fully charged. Accordingly, the threshold for the embodiment described herein may suitably be 10 volts DC. To determine whether the voltage across the hold-up capacitor 306 exceeds the threshold, the processing circuit 324 obtains a voltage measurement from the voltage divider 330. In this embodiment, the processing circuit 324 first digitizes the voltage measurement from the voltage divider 330 and compares the digital value to a digital value corresponding to the threshold. In other embodiments, the voltage divider 330 can be configured to generate a sufficient analog voltage for the processing circuit to detect a logical "1" value when the sensed voltage across the hold-up capacitor 306 exceeds the threshold value.

In any event, if the processing circuit 324 determines that the voltage across the hold-up capacitor 306 does not exceed the threshold, then the processing circuit 324 returns to step 404. After a duration of time following initial power-up, the hold-up capacitor 306 will fully charge and the voltage across the hold-up capacitor 306 will exceed the threshold. Accordingly, when the processing circuit 324 determines that that the voltage across the hold-up capacitor 306 exceeds the threshold, the processing circuit 324 proceeds to step 406.

In step 406, the processing circuit 324 loads previously stored critical data from the flash memory 326, and erases at least a section of the flash memory 326. The previously stored critical data is the data last stored at the last power interruption, such as the data stored in step 414, discussed further below, or as the data stored in step 222, discussed above in connection with FIG. 2. Such critical data is needed for one or more normal metering operations, and can include an accumulated energy usage value, and/or billing values, as well as a time stamp of the power outage.

In general, the processing circuit 324 also erases in step 406 a portion of the flash memory 326 in which critical information will be stored upon the next power interruption or power down.

In one embodiment, the processing circuit 324 uses a single memory location 326a for all critical data. In such a case, the processing circuit 324 in step 406 must first obtain the critical data from the flash memory 326 and then erase that location 326a of the memory 326 for storage of critical data at the next power interruption.

However, it is preferable to use two alternating memory locations for storage of critical data, such as discussed above in connection with FIGS. 1 and 2. In this case, if a power interruption occurs in the middle of step 406, the hold-up capacitor 306 need not complete the erasure task prior to re-storing the critical data to the flash memory 326. Instead, the use of two alternating memory locations 326a, 326b in the flash memory 326 ensures that even if power is interrupted immediately after being re-stored (i.e. in the middle of step 406), another erased memory location is available for the storage of critical data.

To this end, the processing circuit 324 in step 406 will first erase the one of the memory locations 326a or 326b where critical data was not most recently stored. This is illustrated, for example, by steps 204, 206 and 214 of FIG. 2. The processing circuit 324 thereafter recalls the critical data from the other memory location 326a or 326b in which the critical data was most recently stored. This is illustrated, for example, by steps 208 and 216.

Referring again to FIG. 4, once the processing circuit 324 obtains the stored critical data, and once at least one critical data memory location 326a or 326b is erased, the processing circuit 324 has completed step 406 and may proceed to step 408.

In step 408, the processing circuit 324 operates at full processing speed. Accordingly, another factor that allows the hold-up capacitor 306 to be of limited size and capacity is the fact that the critical data erase cycle is performed at a lower and more energy efficient clock speed. This feature is particularly useful if alternate memory locations are not employed. When critical data is stored to a single location, that erasure must be completed to make the location available for storage of critical data if a power outage returns during the start-up process of step 406. Once the critical data is retrieved and the data is erased, the processing circuit 324 may operate at full clock speed.

Thereafter, in step 410, the processing circuit 324 performs its normal metering operations. Such operations include receiving digital energy consumption information from the metering circuit and further processing the energy consumption information for billing, display, communication and/or storage purposes. Various metering operations, and their implementation in a processing device, would be known to those of ordinary skill in the art.

Contemporaneously, with step 410, the processing circuit 324 in step 412 determines whether the voltage across the capacitor 306 falls below a predetermined threshold. The threshold corresponds to one that indicates that power has been interrupted from the switching power supply 302, typically from a loss of utility power. To this end, the processing circuit 324 obtains the voltage measurement from the voltage divider 330, digitizes the measurement, and compares the digitized measurement to a predetermined power outage threshold value. It will be appreciated that the thresholds of step 404 and step 412 are typically not the same.

If in step 412 the processing circuit 324 determines that that the voltage across the hold-up capacitor 306 did not fall below the threshold, then the processing circuit 324 returns to contemporaneous operations of step 410 and 412 for normal metering. However, if the processing circuit 324 determines that that the voltage across the hold-up capacitor 306 has fallen below the threshold, then processing circuit 324 proceeds to step 414.

In step 414, the processing circuit 324 lowers its clock speed again to the reduced speed, and then writes the critical data of the meter to the flash memory 326. To this end, the processing circuit 324 obtains the critical data stored in local RAM or data registers within the processing circuit 324 itself, and/or retrieves the data from the RAM or registers of the metering circuit 318. If two memory locations 326a, 326b are used in alternating fashion similar to the method described above in connection with FIG. 2, then the processing circuit 324 writes the critical data to the previously erased memory location 326a or 326b. The processing circuit 324 thereafter ceases to operate.

Accordingly, in addition to the features noted in the embodiment of FIGS. 1 and 2, the embodiment of FIGS. 3 and 4 further employ use of different clock speeds to further reduce the "worst case scenario" requirements of the hold-up capacitor 306. Namely, the reduced clock speed during start-up (steps 404, 406) can allow for memory erasure to be completed (and subsequent storage of values) in the event of a power outage during start-up.

Furthermore, the embodiment of FIGS. 3 and 4 illustrates how the reduced size hold-up capacitor may be configured for use in a meter that also includes a separate boost capacitor 310 for AMR transmissions. To this end, the inclusion of the diode 304 between the boost capacitor 310 and the hold-up capacitor 306 ensures that the hold-up capacitor 306 is never inadvertently used to power the AMR transmitter 314.

It will be appreciated that the above-describe embodiments are merely exemplary, and that those of ordinary skill in the art may readily devise their own implementations and adaptations that incorporate the principles of the present invention and fall within the spirit and scope thereof.

We claim:

1. A system for use in a utility meter, comprising:
a utility meter housing including metrology circuitry configured to generate metering data regarding electrical power provided to the load, the utility meter including a connection to the utility power service;
a power supply;
a non-volatile memory;
an energy storage device operably coupled to the power supply;
a control circuit operably coupled to receive power generated by the power supply and receive power from the energy storage device, the control circuit configured to,
perform a start-up operation responsive to receiving a first bias power signal;
erase first metering information stored in the non-volatile memory during the start-up operation;
process, subsequent to erasing the first memory location and after completion of the start-up operation, metering data received from the metrology circuit to generate second metering information;
receive a first interruption signal indicative of an interruption of power in the power supply;
store, responsive to receiving the first interruption signal, second metering information in the non-volatile memory using power from the energy storage device.

2. The system of claim 1, wherein the control circuit and at least a portion of the metrology circuit comprises a single processing device.

3. The system of claim 1, wherein the control circuit is further configured to, during the start-up operation, retrieve previously-stored metering information from the non-volatile memory; and
wherein the control circuit is configured to process the metering data using the retrieved previously-stored metering information.

4. The system of claim 3, wherein the control circuit is further configured to, after receiving the first interruption signal:
receive a subsequent bias power signal;
erase the previously-stored metering information stored in the non-volatile memory;
retrieve the second metering information from the non-volatile memory; and
process the metering data using the retrieved second metering information.

5. The system of claim 1, wherein:
the non-volatile memory includes a first memory location and a second memory location;
the control circuit is configured to,
erase the first metering information from the first memory location during the start-up operation;
retrieve the previously stored metering information from the second memory location during the start-up operation;
store the second metering information in the first memory location after completion of the start-up operation; and
erase the previously stored metering information from the second memory location.

6. The system of claim 5, further comprising a value stored in the non-volatile memory including information identifying one of the first and second memory locations.

7. The system of claim 1, wherein the metrology circuit includes a first processing circuit, and wherein the control circuit includes a second processing circuit.

8. The system of claim 1, further comprising a voltage sensing circuit operably coupled to the power supply and configured to generate the first interruption signal indicative of the interruption of power in the power supply.

9. The system of claim 1, wherein the power supply includes a switched mode power supply coupled to a voltage regulator.

10. The system of claim 9, further comprising a voltage sensing circuit operably coupled to sense a voltage between the switched mode power supply and the voltage regulator, and configured to generate the first interruption signal indicative of the interruption of power in the power supply based on the sensed voltage.

11. The system of claim 10, wherein the energy storage device is operably coupled to a first node between the switched mode power supply and the voltage regulator.

12. The system of claim 11, further comprising a rectifier serially coupled between the switched mode power supply and the first node.

13. The system of claim 12, further comprising a second voltage regulator coupled to a second node between the switched mode power supply and the rectifier.

14. The system of claim 13, wherein the second voltage regulator is further coupled to a transmitter.

15. The system of claim 6, further comprising a voltage sensing circuit, a rectifier, a second voltage regulator and a transmitter;
and wherein the power supply includes a switched mode power supply coupled to a first voltage regulator;
the voltage sensing circuit is operably coupled to sense a voltage between the switched mode power supply and the voltage regulator, and configured to generate the first interruption signal indicative of the interruption of power in the power supply based on the sensed voltage;
the energy storage device is operably coupled to a first node between the switched mode power supply and the voltage regulator;
the rectifier is serially coupled between the switched mode power supply and the first node;

the second voltage regulator is coupled to a second node between the switched mode power supply and the rectifier; and the second voltage regulator is further coupled to the transmitter.

16. A method for use in a utility meter, comprising:
a) responsive to receiving bias power to a processing circuit, using the processing circuit to perform a start-up operation including erasing first metering information from a non-volatile memory;
b) processing, subsequent to step a) and after completion of the start-up operation, metering data received from a metrology circuit within the meter to generate second metering information;
c) receiving a first interruption signal indicative of an interruption of power in the power supply;
d) storing, responsive to receiving the first interruption signal, second metering information in the non-volatile memory using power from the energy storage device.

17. The method of claim 16, further comprising, before step b), retrieving previously stored metering information from the non-volatile memory; and wherein step b) further comprises processing the metering data using the retrieved previously stored metering information.

18. The method of claim 16, wherein:
step a) further comprises erasing first metering information from a non-volatile memory while the processing circuit operates at a first clock speed; and
step b) further comprises processing the metering data received from the metrology circuit while the processing circuit operates at a second clock speed that exceeds the first clock speed.

19. The method of claim 16, wherein:
step a) further comprises erasing the first metering information from a first memory location of the non-volatile memory during the start-up operation;
step d) further comprises storing the second metering information in the erased first memory location.

20. The method of claim 19, further comprising:
during the start-up operation, retrieving previously stored metering information from a second memory location the non-volatile memory; and wherein step b) further comprises processing the metering data using the retrieved previously stored metering information.

* * * * *